United States Patent
Akahori et al.

(10) Patent No.: US 6,337,290 B1
(45) Date of Patent: Jan. 8, 2002

(54) SEMICONDUCTOR DEVICE HAVING FLUORINE-ADDED CARBON DIELECTRIC FILM AND METHOD OF FABRICATING THE SAME

(75) Inventors: Takashi Akahori, Hachioji; Akira Suzuki, Sakai, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/612,224

(22) Filed: Jul. 7, 2000

Related U.S. Application Data

(63) Continuation of application No. PCT/JP99/00034, filed on Jan. 8, 1999.

(30) Foreign Application Priority Data

Jan. 10, 1998 (JP) .............................. 10-014956
Oct. 20, 1998 (JP) .............................. 10-316857

(51) Int. Cl.$^7$ .................... H01L 23/48; H01L 23/52; H01L 29/40
(52) U.S. Cl. ....................... 438/780; 438/785
(58) Field of Search ................. 438/783, 780, 438/781, 785

(56) References Cited

U.S. PATENT DOCUMENTS 6,091,081 A * 7/2000 Matsubara et al. ........... 257/52
6,121,162 A * 9/2000 Endo ......................... 438/787
6,171,945 B1 * 1/2001 Mandal et al. ............... 438/622

FOREIGN PATENT DOCUMENTS

| JP | 8-264648 | 10/1996 |
| JP | 9-246242 | 9/1997 |
| JP | 10-336461 | 12/1998 |
| JP | 11-16918 | 1/1999 |

* cited by examiner

*Primary Examiner*—David Nelms
*Assistant Examiner*—Thao P. Le
(74) *Attorney, Agent, or Firm*—Finnegan, Henderson, Farabow, Garrett & Dun

(57) ABSTRACT

A semiconductor device has a dielectric film made of a fluorine-added carbon film formed on a substrate, a metallic layer formed on the fluorine-added carbon film and an adhesive layer formed between the dielectric film and the metallic layer. The adhesive layer is made of a compound layer having carbon and the metal (or metal the same as the metal included in the metallic layer), to protect the metallic layer from being peeled-off from the fluorine-added carbon film.

13 Claims, 17 Drawing Sheets

| | EMBODIMENT (kPsi) | SAMPLE (kPsi) |
|---|---|---|
| A | 5.26 | $\leq 1.0$ |
| B | 6.80 | $\leq 1.0$ |
| C | 7.75 | $\leq 1.0$ |
| D | 6.17 | $\leq 1.0$ |

| | | NO PRE-Ar SPUTTERING (kPsi) | PRE-Ar SPUTTERING (kPsi) |
|---|---|---|---|
| Ti LAYER | EMBODIMENT 1 | 5.4 | 6.8 |
| | 2 | 3.8 | 4.2 |
| | 3 | 4.8 | 5.9 |
| | 4 | 3.2 | 3.8 |
| Ta LAYER | 5 | 4.8 | 5.2 |
| | 6 | 3.2 | 4.3 |
| | 7 | 2.8 | 3.9 |
| | 8 | 2.4 | 3.8 |
| W LAYER | 9 | 2.5 | 6.0 |

|   | EMBODIMENT (kPsi) | SAMPLE (kPsi) |
|---|---|---|
| A | 5.2 | ≤ 1.0 |
| B | 5.9 | ≤ 1.0 |
| C | 6.8 | ≤ 1.0 |
| D | 6.2 | ≤ 1.0 |

SEMICONDUCTOR DEVICE HAVING FLUORINE-ADDED CARBON DIELECTRIC FILM AND METHOD OF FABRICATING THE SAME

This application is a continuation of International Application No. PCT/JP99/00034, filed Jan. 8, 1999, the content of which is incorporated herein by reference.

TECHNICAL FIELD

The present invention relates to a semiconductor device having a fluorine-added carbon dielectric film and a method of fabricating the semiconductor device.

BACKGROUND ART

Finer patterns and multi-layered circuitry have been advanced for higher integration of semiconductor devices. One of the techniques is multilevel interconnection structure which an n-wiring layer and an (n+1)-wiring layer are connected via a conductive layer with a thin interlayer dielectric film.

One representative of the interlayer dielectric film is an $SiO_2$ film having a specific dielectric constant of about 4. Efforts have been made however for discovering materials having smaller specific dielectric constants for faster semiconductor devices. A choice is SiOF films having a specific dielectric constant of 3.5.

The inventors of the present invention have focused on fluorine-added carbon films having a much smaller specific dielectric constant. The fluorine-added carbon film is termed a CF film herein after.

Semiconductor device structures having a CF-dielectric film requires a wiring layer of aluminum (Al), for example, formed on the CF-dielectric film and tungsten (W) wiring for connecting an n-stage Al layer and an (n+1)-stage Al layer. Electromigration would however occur on Al layers to cut off the layers when a current flows therethrough. A titanium nitride (TiN) layer as a reinforcing material for the Al layer and a Ti layer formed between the TiN layer and CF film have been under consideration.

However, CF films are similar to polytetrafluoroethylene, and have a low level of adhesiveness. Deposition of W wiring heats the CF film to about 400° C., for example, to cause evaporation of the interface between the CF film and Ti layer, thus resulting in that the CF film is peeled off from the Ti layer.

Semiconductor device structures having a CF film as an interlayer dielectric film have therefore not been achieved so far for practical application.

DISCLOSURE OF THE INVENTION

A purpose of the present invention is to provide a semiconductor device formed with a metallic layer on a fluorine-added carbon film, in which fluorine-added carbon film and the metallic layer are protected from being peeled-off from each other and a method of fabricating such a semiconductor device.

The present invention provides a semiconductor device having a dielectric film made of a fluorine-added carbon film formed on a substrate, a metallic layer formed on the fluorine-added carbon film and an adhesive layer formed between the dielectric film and the metallic layer. The adhesive layer is made of a compound layer including carbon and the metal (or metal the same as the metal included in the metallic layer), to protect the metallic layer from being peeled-off from the fluorine-added carbon film.

Moreover, the present invention provides a method of fabricating a semiconductor device. A dielectric film made of fluorine-added carbon film is formed on a substrate, and fluorine included in a surface of the fluorine-added carbon film is decreased in density. A metallic layer is formed on the surface of the fluorine-added carbon film. An adhesive layer made of a compound layer including carbon and metal the same as metal included in the metallic layer is formed between the fluorine-added carbon film and the metallic layer. After fluorine is decreased in density, while forming a metallic layer on a surface of the fluorine-added carbon film or heating the substrate after the metallic layer is formed, an adhesive layer made of a compound layer including carbon and the metal may be formed between the fluorine-added carbon film and the metallic layer. Moreover, after fluorine is decreased in density, a metallic layer may be formed on a surface of the fluorine-added carbon film by chemical vapor deposition using a deposition gas including metal, to form an adhesive layer made of a compound layer including carbon and the metal between the fluorine-added carbon film and the metallic layer.

BRIEF DESCRIPTION OF THE DRAWINGS

FIG. 24 shows experimental tabulated data of adhesiveness between the CF film and W layer;

BEST MODE FOR CARRYING OUT THE INVENTION

Figure 1:
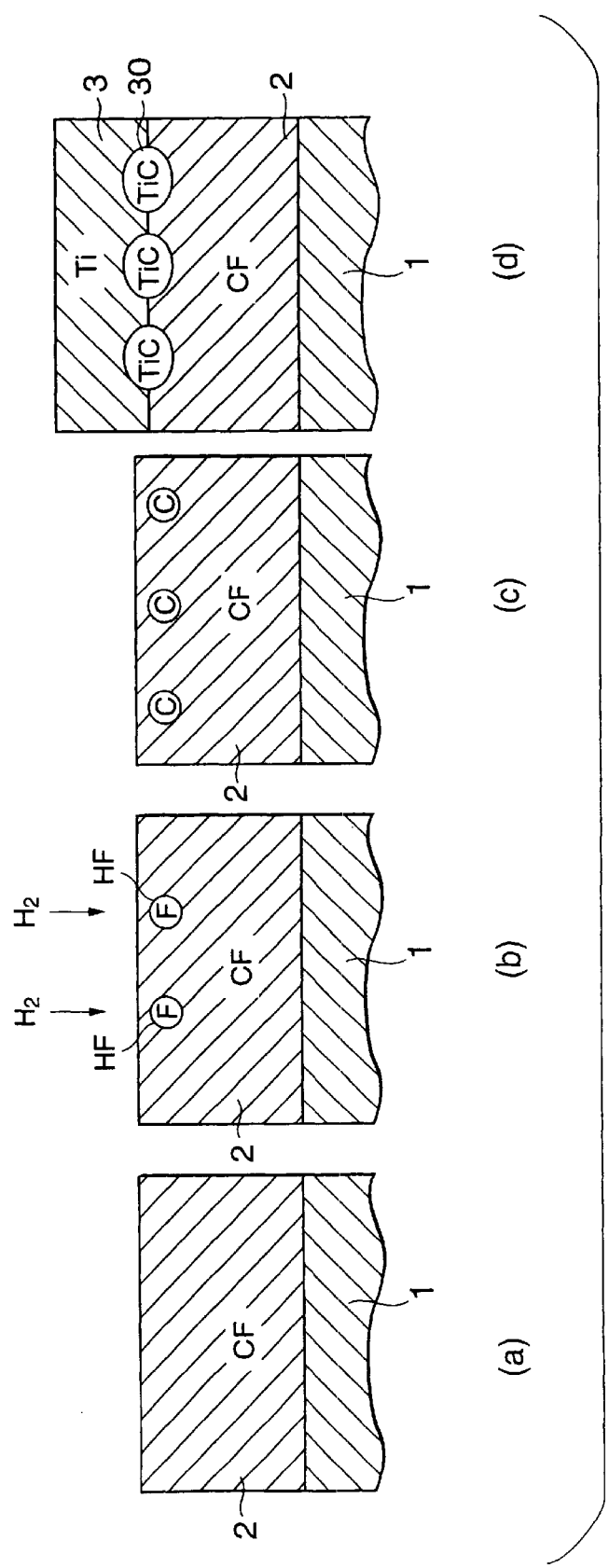
FIG. 1 illustrates an overview of a method of fabricating a semiconductor device according to the present invention.

Described first is an overview of a method of fabricating a semiconductor device according to the present invention with reference to FIG. 1.

As illustrated by (a) of FIG. 1, a dielectric film 2 made of a fluorine-added carbon film is formed on a substrate 1. The fluorine-added carbon film is termed a CF film herein after. Next, as shown in (b) of FIG. 1, the CF film 2 is irradiated with $H_2$ gas plasma.

The $H_2$ plasma radiation causes reaction of fluorine involved in the surface layer of the CF (dielectric) film 2 with hydrogen to become hydrogen fluoride (HF) which flies in all directions. This results in decrease in fluorine (F) at the surface while carbon (C) remains as illustrated by (c) of FIG. 1. The CF film 2 then involves a highly dense carbon at the surface layer (fluorine decreasing process).

Next as shown in (d) of FIG. 1, a metallic layer 3 made of titanium (Ti), for example, is formed on the CF film 2 while the substrate is being heated. During this process, the carbon at the surface layer of the CF film 2 reacts with titanium on the interface between the CF film 2 and Ti layer 3 to form titanium carbide (TiC) 30. An aluminum or tungsten wiring layer (not shown) is then formed on the Ti layer 3 to fabricate a semiconductor device.

The TiC layer 30 formed as an adhesive layer on the interface between the CF film 2 and Ti layer 3 prevents the Ti layer 3 from being peeled off from the CF film 2.

Described next in detail with reference to FIGS. 2 to 10 is an application of the semiconductor device fabrication method as explained above for a multilayer-structure semiconductor device having a CF film as an interlayer dielectric film and an Al wiring layer connected to the semiconductor device via a W layer.

Figure 2:
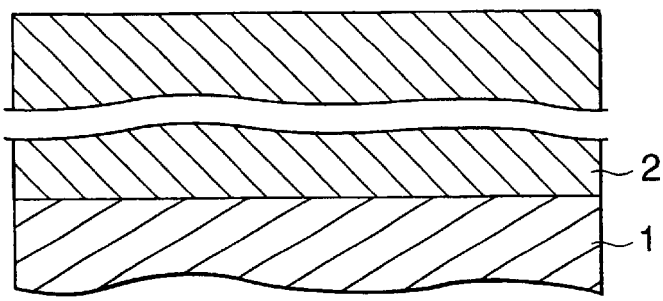
FIG. 2 shows a process of the method of fabricating a semiconductor device according to the present invention.

Firstly, as shown in FIG. 2, a CF film 2 of about 20,000 angstrom in thickness is formed on a substrate 1. The CF film is formed by a plasma system using electron cyclotron resonance (ECR). The ECR-plasma system uses argon (Ar) gas as a plasma gas, and $C_4F_8$ and $C_2H_4$ gases for film deposition, for example. The film deposition gases are transformed into plasma by the plasma gas for CF film deposition.

Figure 3:
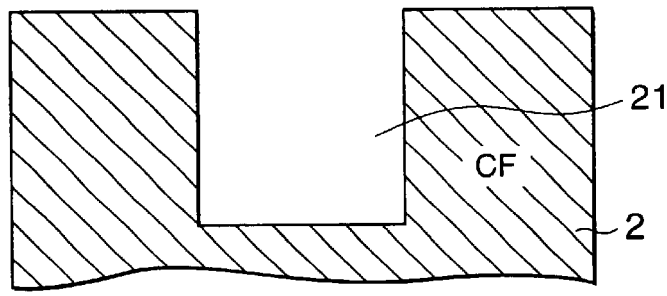
FIG. 3 shows a process of the method of fabricating a semiconductor device according to the present invention.

The next step is a process of forming W wiring on the CF film 2. As shown in FIG. 3, the CF film 2 is processed to open a window 21 to be embedded with tungsten, which corresponds to the surface region where W wiring is to be formed. In detail, a resist pattern is formed on the CF film 2 and etched away by an etching apparatus (not shown) to open the window 21.

Figure 4:
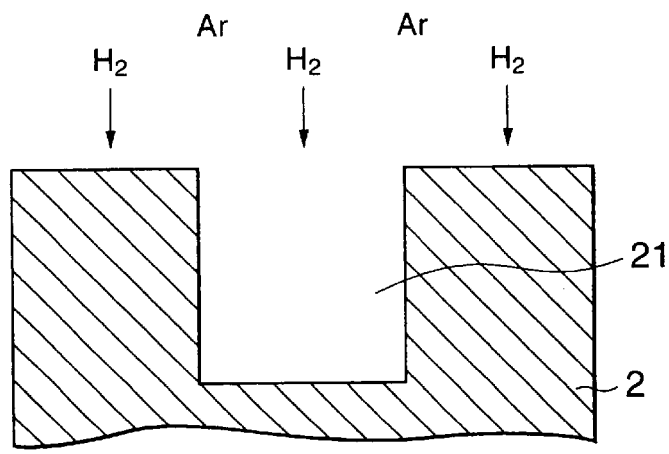
FIG. 4 shows a process of the method of fabricating a semiconductor device according to the present invention.

Hydrogen ($H_2$) plasma is then radiated onto the CF film surface as illustrated by FIG. 4. More precisely, Ar and $H_2$ gases are introduced into a plasma system (FIG. 12) to transform the $H_2$ gas into plasma which is then radiated onto the CF film surface for about 10 seconds. The Ar gas is used to accelerate stable $H_2$ plasma generation. The $H_2$ plasma radiation decreases fluorine while leaves a highly dense carbon at the CF film surface.

Instead of the process described above, fluorine can be decreased by soaking the CF film-formed substrate 1 into $H_2O$ and annealing the substrate at 425° C., for example. In this process, while the substrate 1 has been soaked into $H_2O$, hydrogen of $H_2O$ reacts with fluorine at the CF film surface during annealing to become hydrogen fluoride (HF) which flies in all directions. This results in a highly dense carbon left at the CF film surface.

Figure 5:
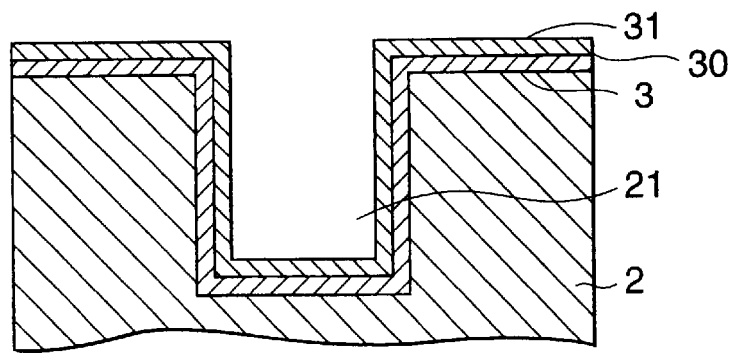
FIG. 5 shows a process of the method of fabricating a semiconductor device according to the present invention.

After the $H_2$ plasma radiation, a Ti layer 3 and a TiN layer 31 are formed on the entire CF film surface, as shown in FIG. 5. More precisely, Ar gas is introduced into a sputtering system (FIG. 13) to sputter a target titanium while a wafer table is being heated to about 300° C., to form the Ti layer 3 of 100 to 300 angstrom in thickness, for example, on the CF film 2.

A mixture of Ar and $N_2$ gases is introduced next into the sputtering system to sputter a target titanium to form the TiN layer 31 of 100 angstrom in thickness, for example, on the Ti layer 3. Through these processes, the Ti and TiN layers 3 and 31 are formed on the entire CF film surface and also the inner wall of the window 21.

When the Ti layer 3 is formed on the CF film 2, a TiC layer 30 of 100 to 120 angstrom in thickness is also formed on the interface between the CF film 2 and the Ti layer 3. Such a TiC layer can be formed by annealing the Ti layer-formed substrate 1 at 400° C. or more.

Figure 6:
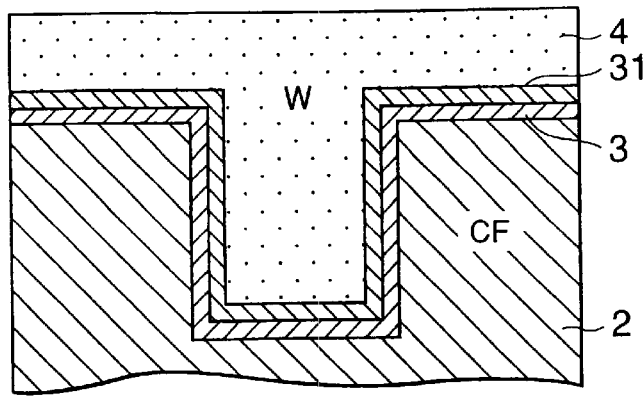
FIG. 6 shows a process of the method of fabricating a semiconductor device according to the present invention.
Figure 7:
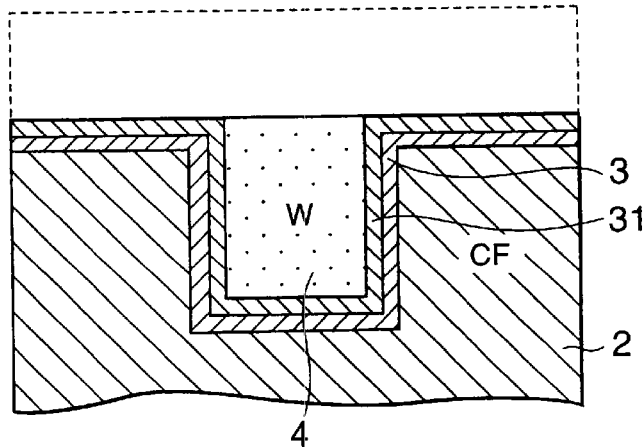
FIG. 7 shows a process of the method of fabricating a semiconductor device according to the present invention.

Next, as shown in FIG. 6, a W (wiring) layer 4 is formed over the Ti layer 3 to fill the window 21 with tungsten. The W layer 4 is then polished by a Chemical Mechanical Polishing (CMP) apparatus (not shown) to remove an excess W layer portion, as shown in FIG. 7.

The succeeding steps are to form an Al wiring layer over the CF film 2 on which the W wiring has been formed.

Figure 8:
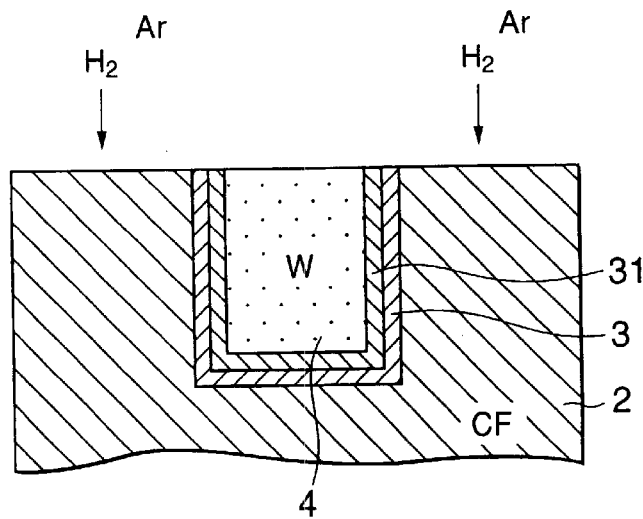
FIG. 8 shows a process of the method of fabricating a semiconductor device according to the present invention.

Firstly, as shown in FIG. 8, $H_2$ plasma is radiated onto the CF film surface that requires the Al wiring layer. This process is like the process shown in FIG. 4, with $H_2$ plasma radiation for about 10 seconds, for example.

Figure 9:
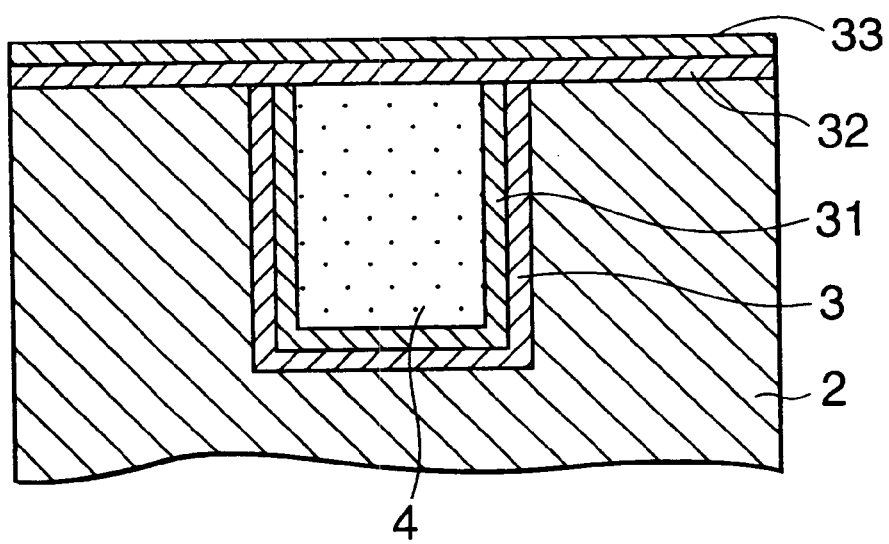
FIG. 9 shows a process of the method of fabricating a semiconductor device according to the present invention.

Next, as shown in FIG. 9, a Ti layer 32 and a TiN layer 33 are formed over the entire CF film surface. This process is like the process shown in FIG. 5, in which the Ti layer 32 of 100 to 300 angstrom in thickness is formed and then the TiN layer 33 of about 100 angstrom in thickness is formed, for example. This process can be omitted by precise control of CMP stop locations to leave the Ti and TiN layers 3 and 31 over the CF film surface.

Figure 10:
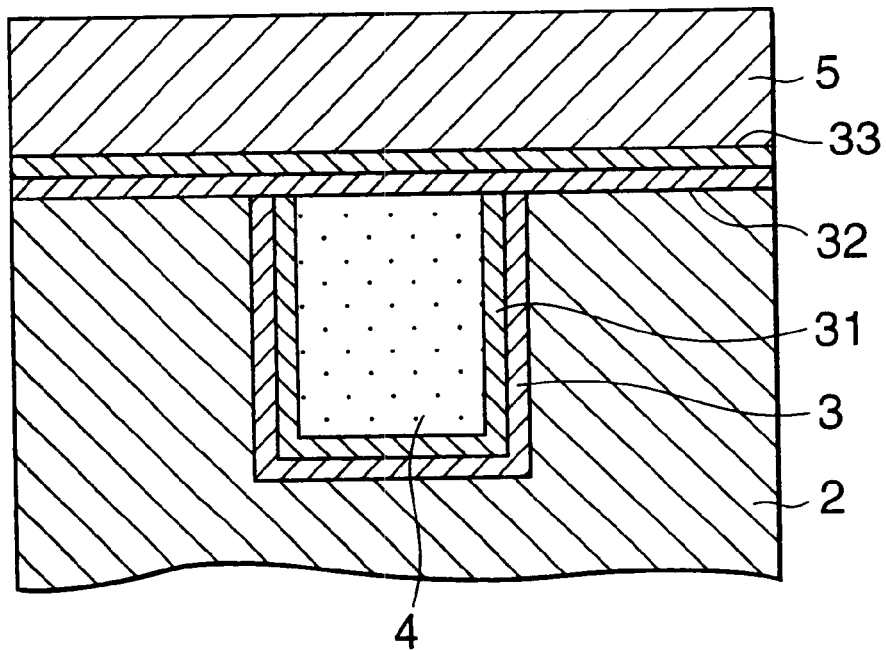
FIG. 10 shows a process of the method of fabricating a semiconductor device according to the present invention.

On the TiN layer 33, an Al (wiring) layer 5 of about 8000 angstrom in thickness is formed, as shown in FIG. 10, to fabricate a multilayer-structure semiconductor device.

Figure 11A:
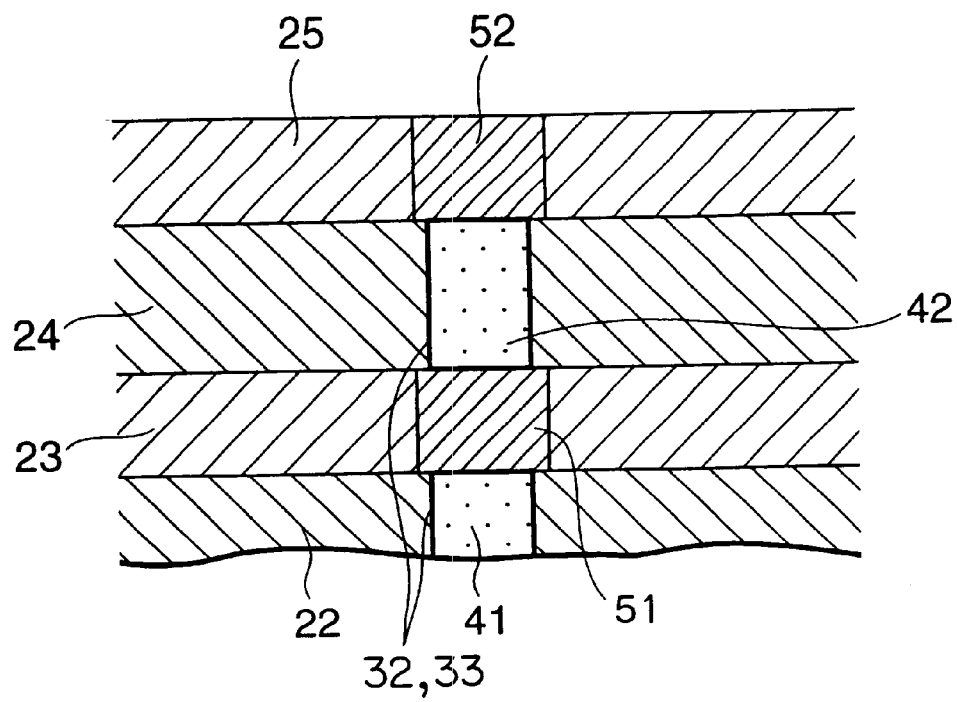
FIGS. 11A and 11B are cross-sectional views each showing a portion of the structure of an embodiment of a semiconductor device according to the present invention.
Figure 11B:
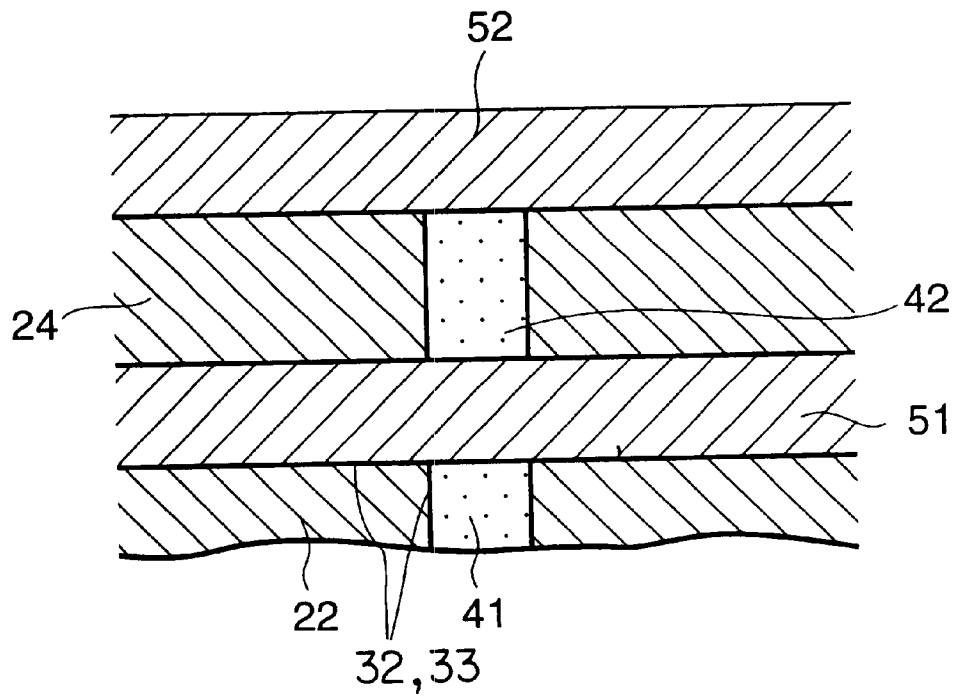

Illustrated by FIGS. 11A and 11B is a portion of a semiconductor device (embodiment 1) fabricated by the processes as described above.

FIGS. 11A and 11B are front and side cross-sectional views of the semiconductor device, respectively.

As shown, the semiconductor device consists of interlayer dielectric films 22 to 25 each made of a CF film, wiring 41 and 42 each made of a W layer, and wiring layers 51 and 52 each made of an Al layer. Furthermore, Ti and TiN layers 32 and 33 are formed between the CF film 22 and W layer 41, and the CF film 22 and Al wiring layer 51. The layers 32 and 33 are drawn as a thick line in the figures.

The plasma system for $H_2$ plasma radiation and the sputtering system for Ti and TiN deposition are described with reference to FIGS. 12 and 13, respectively.

Figure 12:
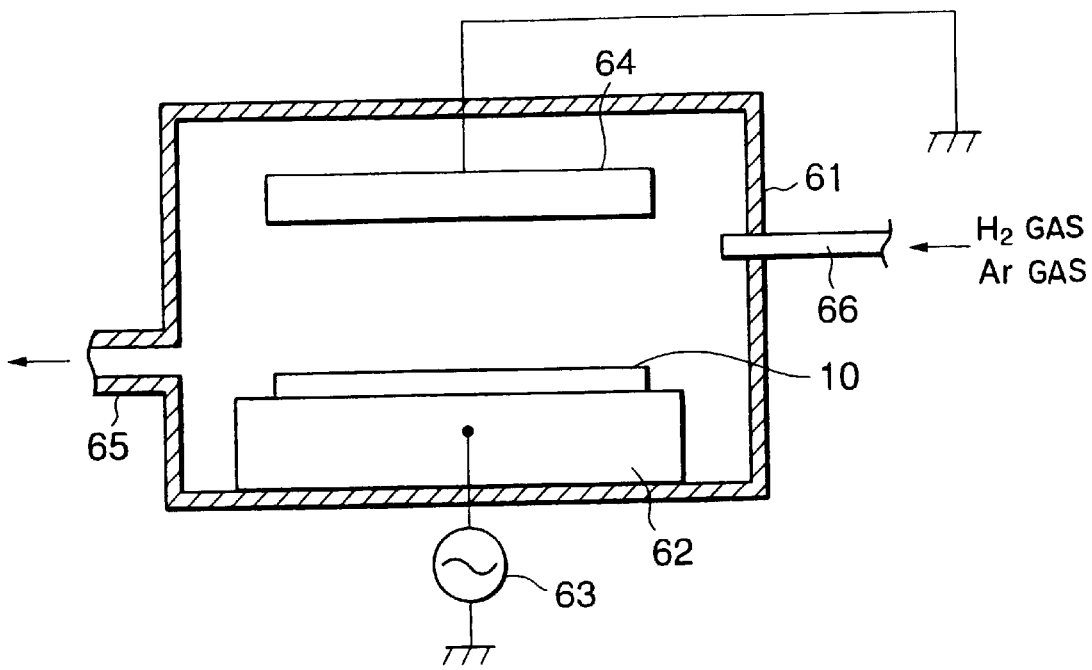
FIG. 12 is a cross-sectional view of a parallel-flat-type plasma system for $H_2$ plasma irradiation.

The plasma system shown in FIG. 12 is a parallel-flat type and consists of a process chamber 61, a table 62 as a lower electrode, a high frequency power supply 63 connected to the table 62, and a grounded upper electrode 64 that faces the table 62.

The processes illustrated by FIGS. 4 and 8 are performed by this type of plasma system.

In detail, a semiconductor wafer 10 is placed on the table 62. A high frequency power is-added between the table 62 and the upper electrode 64 to generate plasma.

Through a gas pipe 66, $H_2$ and Ar gases are introduced into the chamber 61 at specific flow rates while exhaustion through an exhaustion pipe 65, to transform the $H_2$ gas into plasma. The $H_2$ plasma is then radiated onto the CF film surface of the wafer 10 for 10 seconds, for example.

Figure 13:
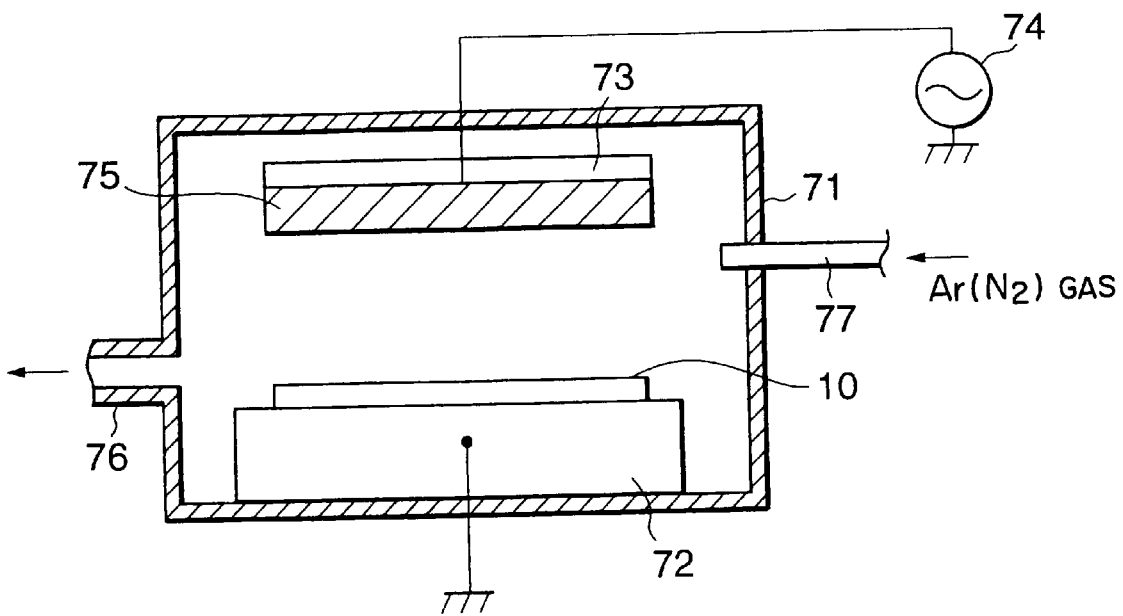
FIG. 13 is a cross-sectional view of a sputtering system for Ti and TiN layer deposition.

The sputtering system shown in FIG. 13 is a parallel-flat type and consists of a process chamber 71, a table 72 as a grounded lower electrode, an upper electrode 73 that faces the lower electrode 72, and a high frequency power supply 74 connected to the upper electrode 73.

The processes illustrated by FIGS. 5 and 9 are performed by this type of sputtering system.

In detail, a high frequency power is-added between the table 72 and the upper electrode 73 while the table is heated to 300° C., for example, to generate plasma. Through a gas pipe 77, Ar gas is introduced into the chamber 71 at a specific flow rate while exhaustion through an exhaustion pipe 76, to transform the Ar gas into plasma. The Ar plasma sputters a target Ti 75 attached to the upper electrode 73 to deposit a Ti film on the CF film of the wafer 10 placed on the table 72. Next, Ar and $N_2$ gases are introduced into the chamber 71 at specific flow rates to be plasma. The Ar and $N_2$ plasma sputters the target 75 to deposit a TiN film on the Ti film.

Figure 14:
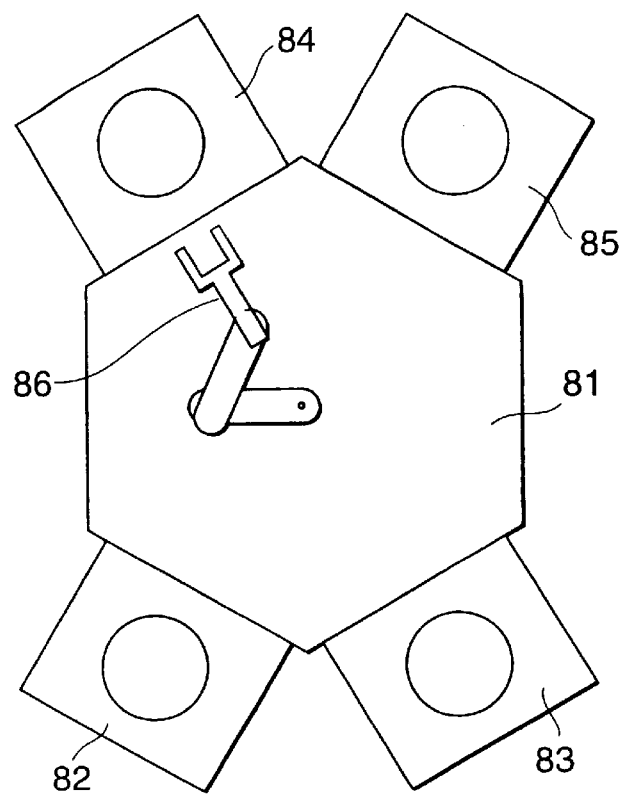
FIG. 14 is a plan view of a cluster tool for sequential performance of $H_2$ plasma radiation and Ti and TiN layer deposition.

Described next with reference to FIG. 14 is a system suitable for fabricating a semiconductor device according to the present invention.

The system shown in FIG. 14 is called a cluster tool having a vacuum chamber 81. The chamber 81 is surrounded by two back-up vacuum cassettes 82 and 83, a chamber 84 enclosing the plasma system of FIG. 12, and a chamber 85 enclosing the sputtering system of FIG. 13.

A transfer arm 86 is installed in the chamber 81 to transfer the wafer 10 between the cassettes 82 and 83 and the chambers 84 and 85.

This system performs $H_2$ plasma radiation and Ti and TiN layer deposition sequentially for an increased high throughput.

According to the semiconductor device fabrication method described as above, the $H_2$ plasma is radiated onto the CF film 2 formed on the substrate 1, and then the Ti layer 3 is formed while heating the substrate 1.

As understood from the experiments which will be discussed later, the TiC layer 30 is formed on the interface between the CF film 2 and the Ti layer 3, which protects Ti layer 3 from being peeled off from the CF film 2.

Moreover, the Ti layer 3, Al wiring layer 5 and w layer 4 are hard to be peeled off from each other because they are metallic layers. This results in that the Al wiring layer 5 and w layer 4 are protected from being peeled off from the CF film 2.

As discussed, a CF film having a low dielectric constant employed as an interlayer dielectric film meets demands for scaling-down and speeding-up for semiconductor devices.

Discussed next is the reason why the Ti and TiN layers 3 and 31 are formed between the CF film 2 and the Al wiring layer 5, and W layer 4.

The Al wiring 5 is not so strong and easily cut out when a current flows therethrough. To overcome this disadvantage, a strong TiN layer 31 is used as a wiring layer to enforce the Al wiring layer 5. The Ti layer 3 is not so strong so that it cannot be used in place of the TiN layer 31.

Also discussed is the reason why the Ti layer 3 is formed between the CF film 2 and the TiN layer 31.

The TiN layer 31 is formed by sputtering a target Ti with Ar and $N_2$ gases as described above. If no Ti layer 3 was formed, the tungsten embedded in the window 21 reacted with nitrogen to form a tungsten nitride which would act as a dielectric film on the tungsten surface.

Discussed further is the reason why the TiC layer 30 is formed between the CF film 2 and the Ti layer 3 for protecting the Ti layer 3 from being peeled off from the CF film 2.

If a metallic layer was directly formed on a CF film with no TiC layer, the metallic layer would be easily peeled off because fluorine of the CF film reacted with the metal to form a metallic fluoride on the interface between the CF film and metallic layer. For example, if a Ti layer was directly formed on a CF film, a $TiF_4$ layer would be formed on the interface between the CF film and Ti layer.

Metallic fluorides usually have a low sublimation point and also a low melting point, for example, the sublimation point of $TiF_4$ is 284° C. After the Ti layer is formed, the substrate will be heated to 400° C. or more, for example. Actually, the W layer is formed at about 400° C. in the embodiments according to the present invention. The substrate would be heated to a temperature over the sublimation point of $TiF_4$ if no TiC layer was formed between the CF film 2 and Ti layer 3 in the embodiments. This resulted in sublimation of $TiF_4$ on the CF film, which would cause peeling-off of the Ti layer from the CF film.

On the other hand, according to the present invention, the TiC layer 30 is formed on the interface between the CF film 2 and Ti layer 3. The TiC layer 30 has a melting point of 3257° C., and is stable without sublimation while the substrate 1 is being heated for W layer deposition because the melting point is much higher than the temperature for heating the substrate 1. The TiC layer 30 will therefore not be peeled off from the CF film 2; and hence acts as an adhesive layer between the CF film 2 and Ti layer 30 to prevent peeling-off between the film and layer. Moreover, The TiC layer 30 exhibits 61 $\mu\Omega$.cm in conductivity which offers stable electrical contact between the Al wiring layer 5 and W layer 4 even though the TiC layer 30 is formed between the CF film 2 and the Al wiring layer 5, and the W layer 4. This requires no peeling-off of the TiC layer 30 when the Al wiring layer 5 and W layer 4 are formed. On the contrary, if the TiC layer 30 was a dielectric layer, it had to be peeled off when the Al wiring layer 5 and W layer 4 were formed.

Other than titanium, the semiconductor fabrication method according to the present invention can further be-added to form a metallic layer, such as, tungsten, molybdenum (Mo), chromium (Cr), cobalt (Co), tantalum (Ta), niobium (Nb) and zirconium (Zr), on the CF film. Melting points of W-fluoride and Mo-fluoride are 20° C. or less, and those of Cr-fluoride and Co-fluoride are 100° C. or less. On the other hand, carbon compounds of these metals have melting points of about 2000 to 4000° C. Carbon compounds of Ta, Nb and Zr also have very high melting points. The Carbon compounds of these metals will thus be stable when heated to 400° C. for W layer deposition; and act as an adhesive layer to protect the W layer from being peeled off from the CF film.

Discussed next is an experiment I to verify advantages of the semiconductor device fabrication method according to the present invention.

The semiconductor device used in this experiment has a 0.5 $\mu$m-thick CF film on a silicon substrate, and a 100 angstrom-thick Ti layer and a 500 angstrom-thick TiN layer on the CF film.

This semiconductor device was fabricated as follows:

A silicon substrate was placed in an ECR plasma system as described later, and a CF film was formed on the substrate by introducing Ar, $C_4F_8$, and $C_2H_4$ gases at flow rates of 150 sccm, 40 sccm and 30 sccm, respectively. The silicon substrate was then annealed for two hours at 425° C. in a nitrogen gas environment. After the annealing, $H_2$ and Ar gases were introduced at flow rates of 306 sccm and 30 sccm, respectively, to radiate $H_2$ plasma on the CF film for 13 seconds at 2700W-microwave (high frequency power supply 93) and 0W-bais (high frequency power supply 98). The power supplies 93 and 98 will be described later.

The CF film-formed substrate was then placed in the sputtering system shown in FIG. 13. The substrate was formed with a Ti layer on the CF film surface by introducing Ar gas at a flow rate of 700 sccm. After this, Ar and $N_2$ gases were introduced at flow rates of 40 sccm and 120 sccm, respectively, to form a TiN layer on the Ti layer at 1200W-bias (high frequency power supply 74).

Figure 15:
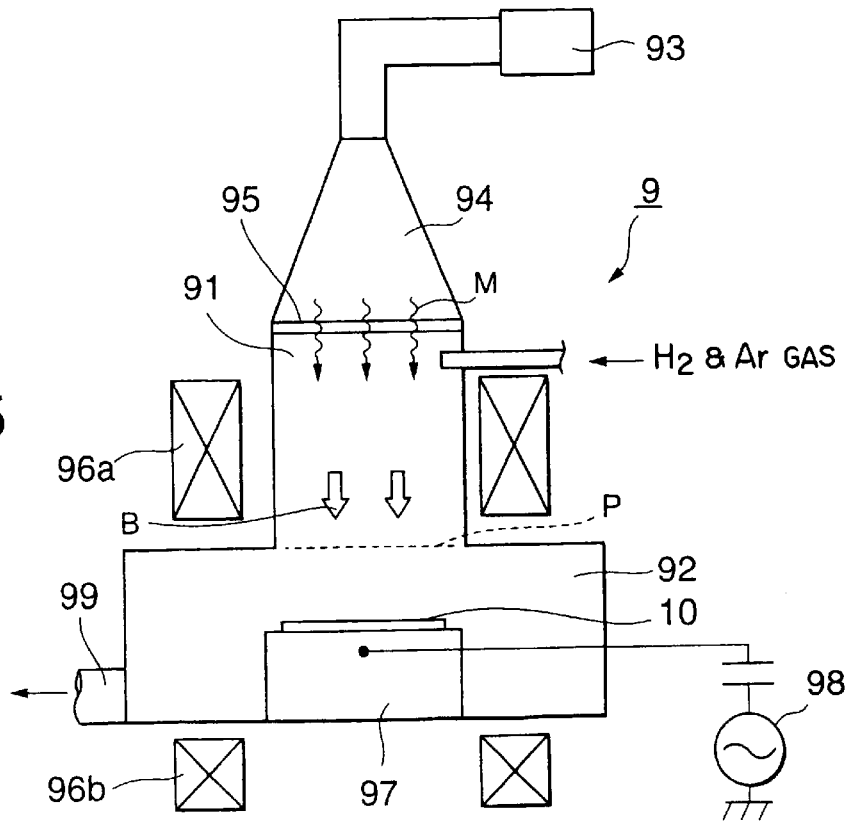
FIG. 15 is a cross-sectional view of an Electron Cyclotron Resonance (ECR) plasma enhanced system for CF film deposition.

Described next with reference to FIG. 15 is an ECR plasma system used for CF film deposition and $H_2$ plasma radiation.

The ECR plasma system has a vacuum chamber 9 that consists of a plasma chamber 91 and a film deposition chamber 92. The high frequency power supply 93 generates a microwave M of 2.45 GHz, for example, which is-added to the vacuum chamber 9 through a wave guide 94 and a window 95. A main electromagnetic coil 96a provided around the plasma chamber 91 and an auxiliary electromagnetic coil 96b provided under the film deposition chamber 92 generate a magnetic field B from the plasma chamber 91 to the deposition chamber 92 at 875 gauss around an ECR point P. The interaction between the microwave M and magnetic field B will generate electron cyclotron resonance at the ECR point P.

The silicon wafer 10 was placed on a table 97 in the deposition chamber 92 for CF film deposition. A bias voltage was-added to the table 97 by a high frequency power supply 98. Argon gas and deposition gas were introduced into the plasma chamber 91 and deposition chamber 92, respectively, during vacuum chamber exhaustion through an exhaust pipe 99, to transform the deposition gas into plasma by electron cyclotron resonance.

A test was conducted to the semiconductor device fabricated as above on peeling between the CF film and Ti layer.

An adhesive tape was stuck on the Ti layer and then peeled therefrom for visual checking of whether or not the Ti layer was peeled off from the CF film. The same test was also conducted to a sample device fabricated for comparison. The sample was fabricated in the same way as for this embodiment except $H_2$ plasma radiation. The results were that the Ti layer on the sample was peeled off, while it was not happened to the embodiment.

Figures 16, 17:
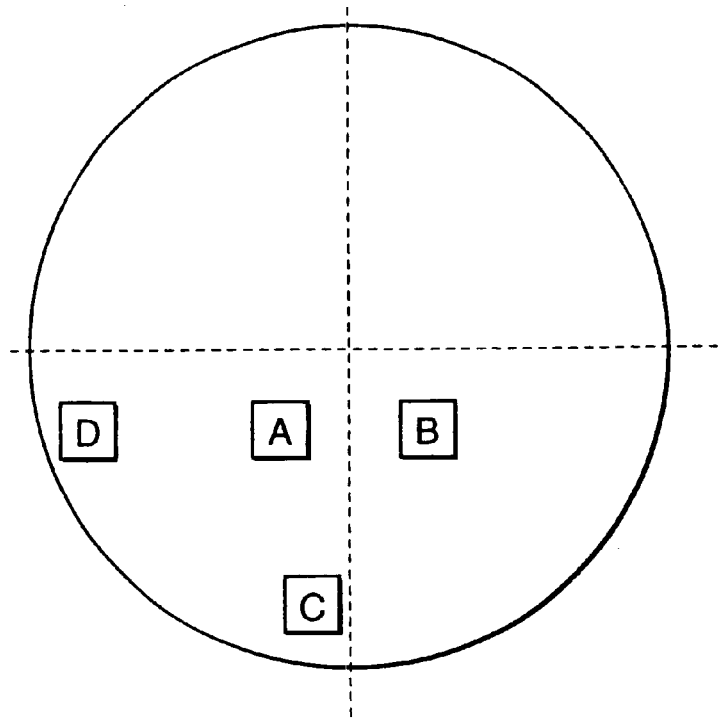
FIG. 16 indicates several points on wafer for judging adhesiveness between the CF film and Ti layer by Sebastian.
FIG. 17 shows experimental tabulated data of adhesiveness between the CF film and Ti layer.

The next test was conducted on adhesiveness between the CF film and Ti layer by Sebastian on the four points A to D indicated in FIG. 16 for the embodiment device and the sample device.

In detail, a CF film was formed on a bare silicon surface, and Ti and TiN layers were formed on the CF film according to the fabrication method of the present invention. A tester lead was fixed on the Ti layer surface by a glue. The lead was then pulled up to detect pull strength (kPsi) per area of tester lead. The pull strength indicates adhesiveness. The greater the pull strength the higher the adhesiveness.

The Sebastian test results are shown in FIG. 17 for the embodiment and the sample device.

As apparent from the experimental tabulated data, the sample device exhibited 1 kPsi or less, while the embodiment exhibited pull strength of 5.26 to 7.75 kPsi on the points A to D. This teaches that the adhesiveness between the CF film and Ti layer of the embodiment is much higher than that of the sample device.

These tests proved that Ti layer deposition after $H_2$ plasma radiation to a CF film forms a TiC (adhesive) layer on the interface between the CF film and Ti layer to offer a high level of adhesiveness therebetween.

Figure 18:
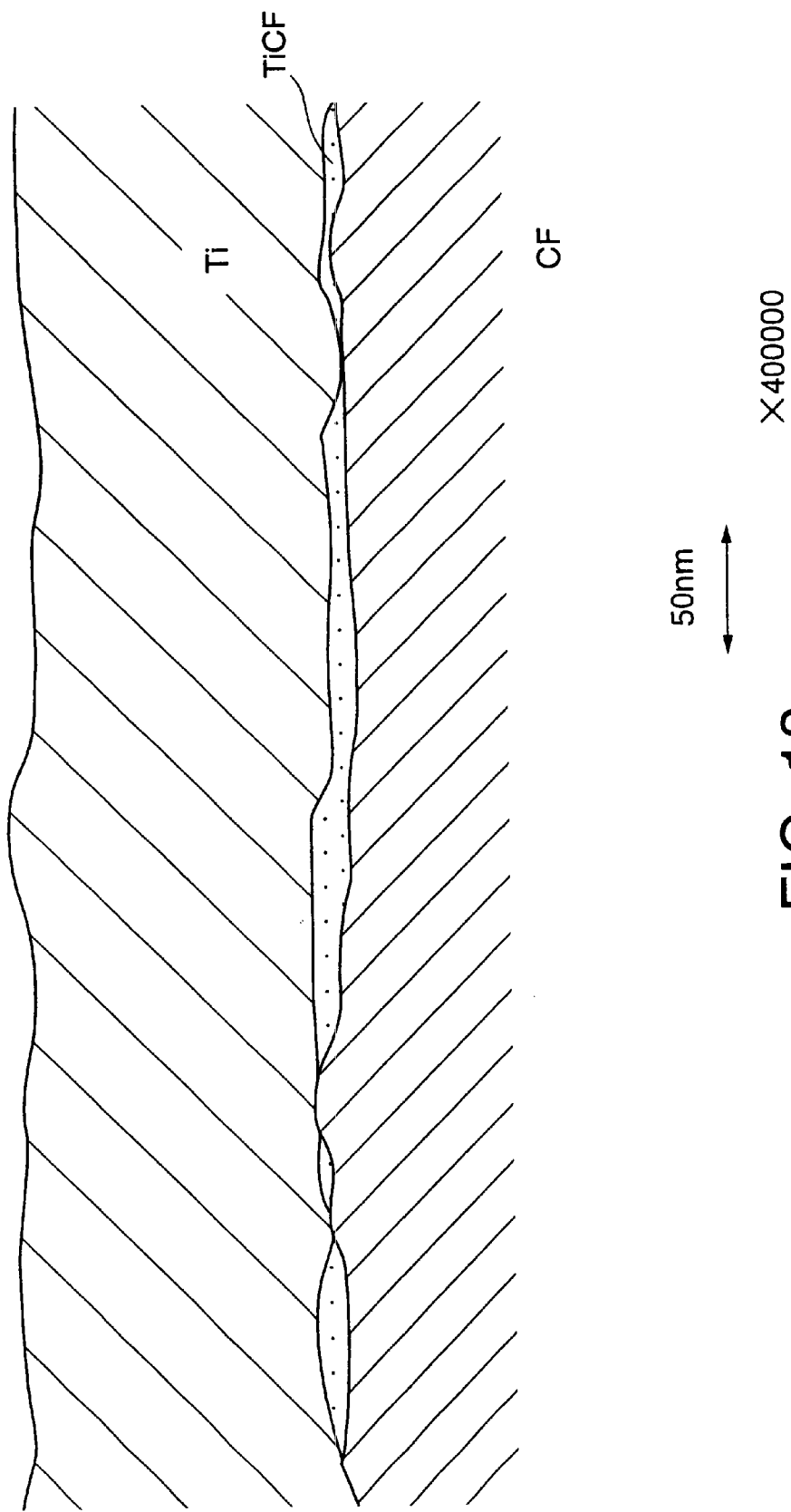
FIG. 18 is a cross-sectional view indicating the interface between the CF film and Ti layer observed by a Transmission Electron Microscope (TEM) at a 400,000× magnification.
Figure 19:
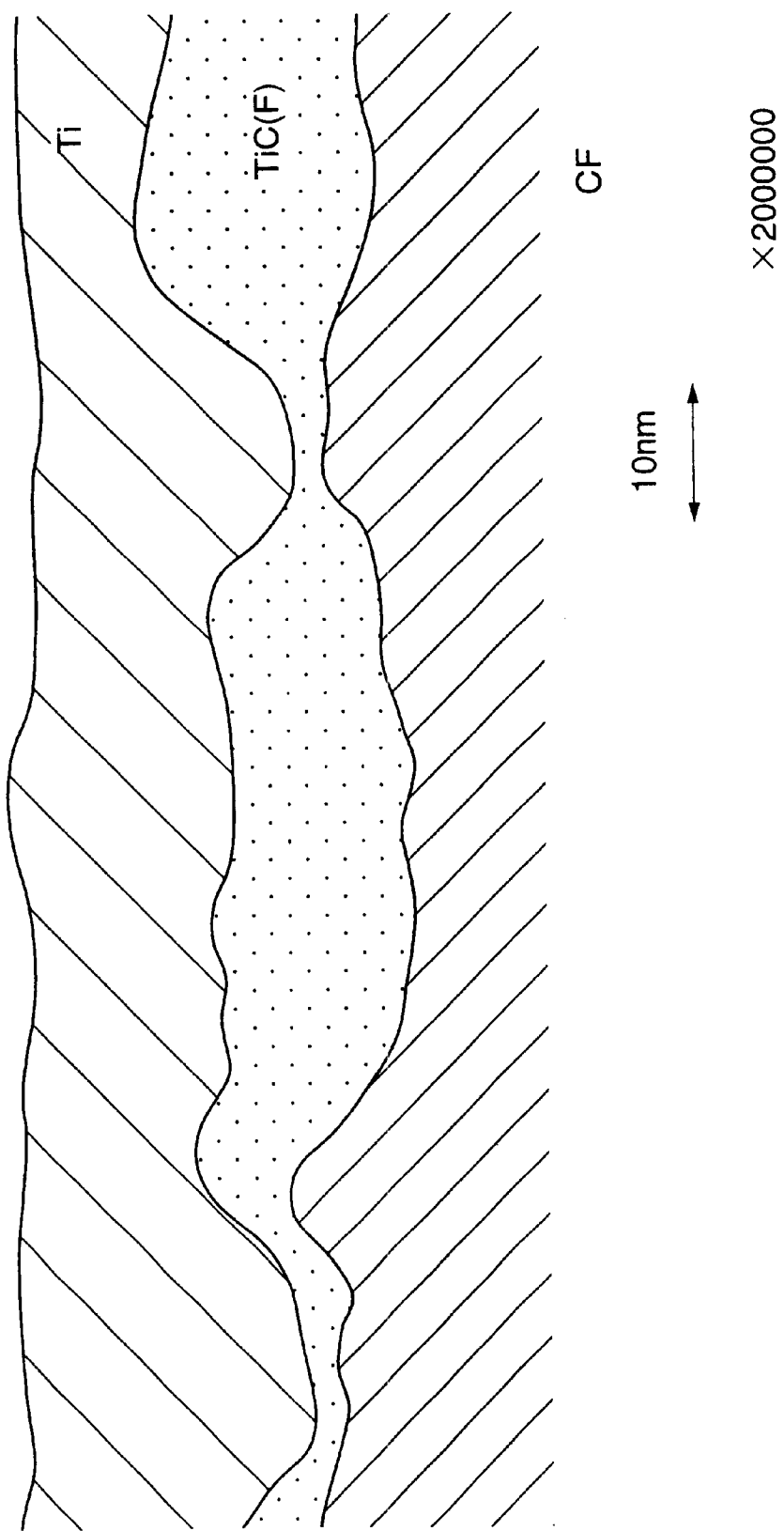
FIG. 19 is a cross-sectional view indicating the interface between the CF film and Ti layer observed by the TEM at a 2,000,000×magnification.

The cross section around the interface between the CF film and Ti layer of the embodiment observed by a Transmission Electron Microscope (TEM) is illustrated by FIGS. 18 and 19, at 400,000× and 2,000,000× magnification, respectively.

These illustrations teach a new layer was formed on the interface between the CF film and Ti layer.

The inventors of the present invention conducted the following analysis to examine the composition of the new layer.

Figure 20A:
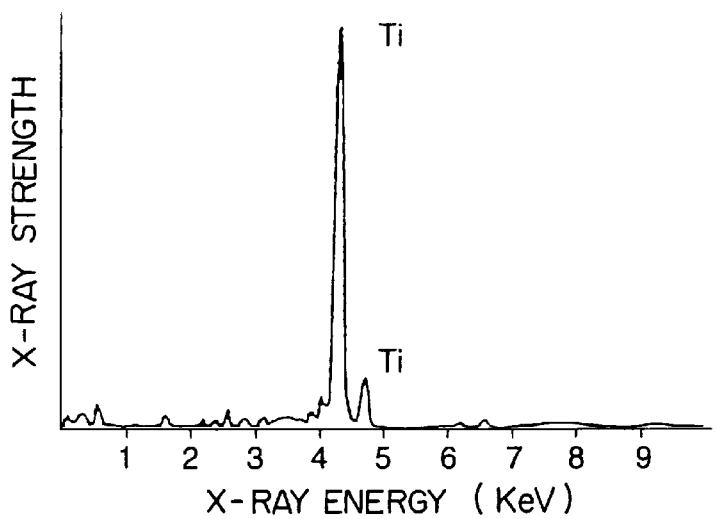
FIGS. 20A, 20B and 20C show graphs representing the results of analysis on the interface between the CF film and Ti layer by energy dispersive X-ray spectroscopy.
Figure 20B:
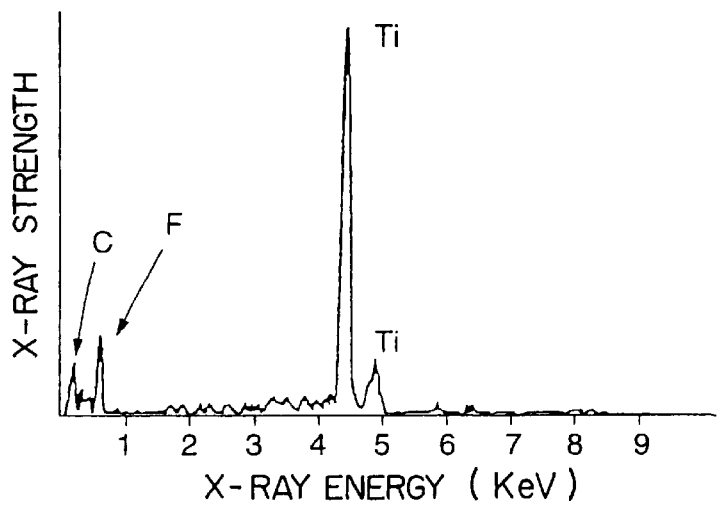
Figure 20C:
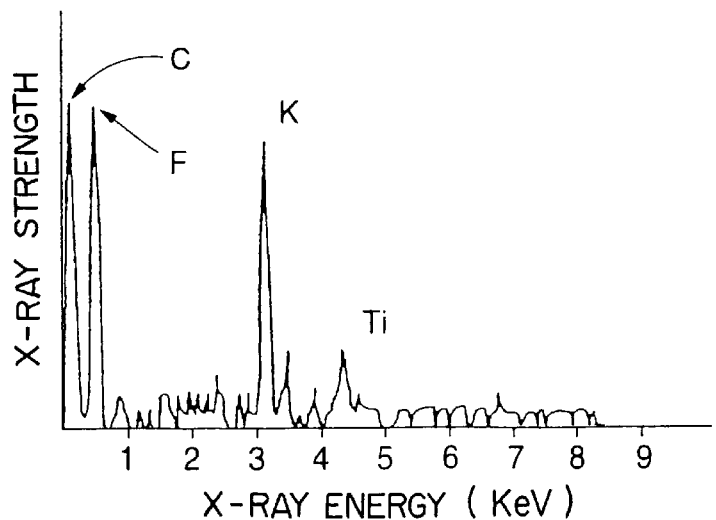

The energy dispersive X-ray spectroscopy was conducted on the CF film, the Ti layer and the interface layer formed therebetween, to form X-ray spectra, as shown in FIGS. 20A, 20B and 20C, respectively.

FIGS. 20A, 20B and 20C indicate X-ray spectrum for the Ti layer, the interface layer and the Cf layer, respectively. The ordinate and abscissa of each graph represent the number of X-rays incident to the X-ray spectroscope and energy of incident X-rays.

FIGS. 20A and 20C show a Ti-peak and a K (potassium)-peak, respectively. The potassium was mixed with the CF film during polishing. FIG. 20B teaches that the interface layer was made of a Ti-C compound. The graph indicates a small C-peak due to low sensitivity at the left side of the spectrum. An actual amount of carbon was larger than the peak value. Titanium, carbon and fluorine in the interface layer were in the ratio of about Ti:C:F=100:30–50:15–30.

Figures 21A, 21B:
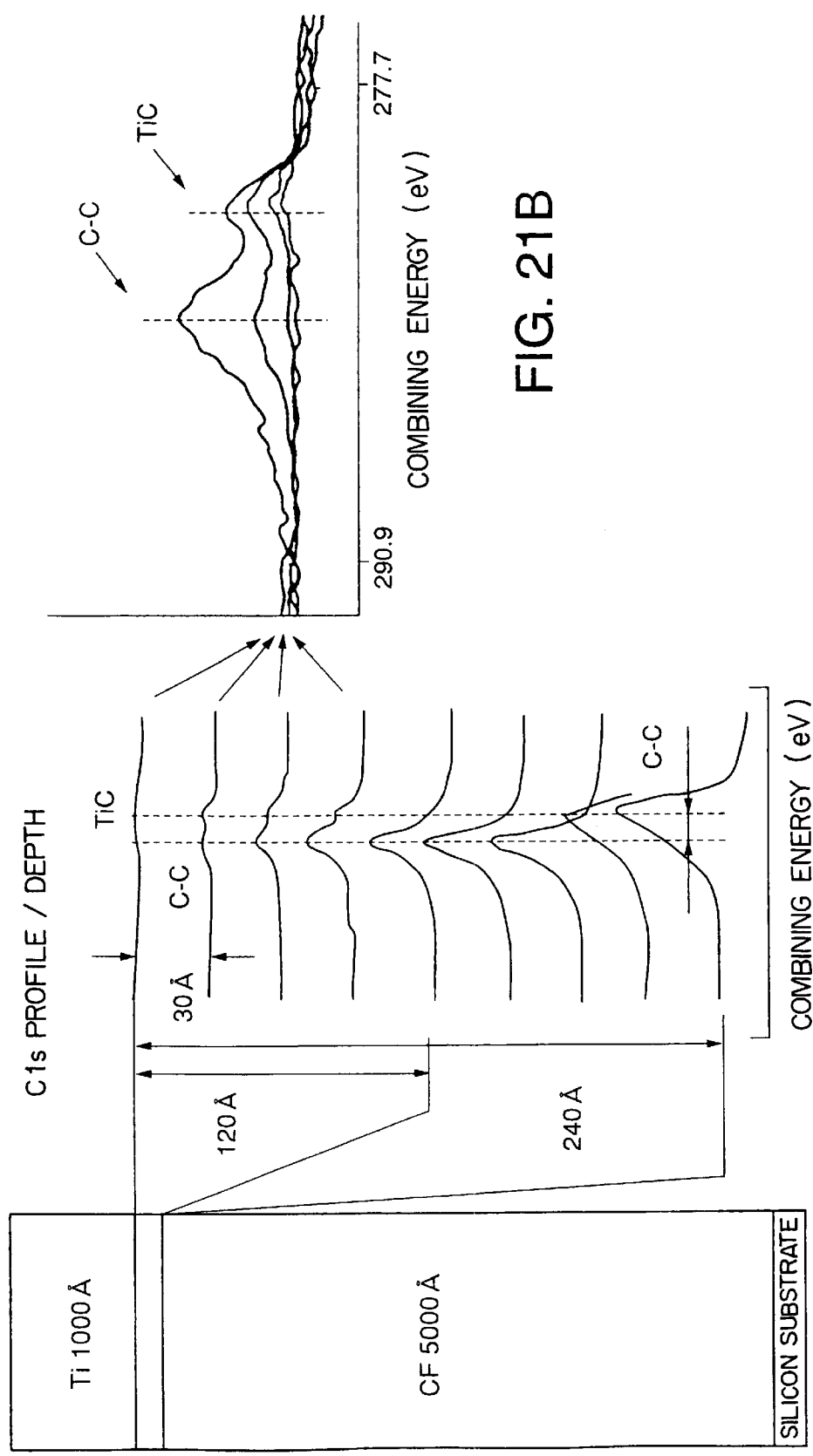
FIGS. 21A and 21B show graphs representing the results of analysis on the interface between the CF film and Ti layer by X-ray Photoelectron Spectroscopy (XPS)

Next, X-ray Photoelectron Spectroscopy (XPS) was conducted for each 30 angstrom-depth from the interface layer surface to 360 angstrom-deep downwards. FIG. 21A shows X-ray spectrum for each 30 angstrom-depth from the interface layer surface to 360 angstrom-deep downwards. On the other hand, FIG. 21B enlarges X-ray spectrum for each 30 angstrom-depth from the interface layer surface to 120 angstrom-deep downwards.

The spectra have a Ti-C (compound) peak from the interface layer surface to 120 angstrom-deep downwards, but not for further deep places. Instead, a C-C (compound) peak is shown from the 120 to 360 angstrom-depth. These spectra teach that the interface layer was about 120 angstrom in thickness and made of TiC. FIG. 21A shows a Ti-C peak on each of the lower two spectra. This is because each Ti-C peak was shifted to the right due to the existence of CF film.

According to the present invention, the Ti layer 3 can be deposited by Chemical Vapor Deposition (CVD) using a deposition gas including titanium. This Ti layer deposition is performed by a parallel-flat-type plasma CVD system shown in FIG. 22.

The plasm CVD system has a process chamber 101 that installs a table 102 as a grounded lower electrode. Provided at the upper section of the process chamber 101 is a gas chamber 103 that faces the table 102. A high frequency power supply 104 is connected to the gas chamber 103 that acts as an upper electrode. Also connected to the gas chamber 103 is a gas pipe 106 via a nut-like joint 105 provided at the top of the chamber 103. The gas chamber 103 is formed with many gas supply pits 107 through which a deposition gas is introduced into the process chamber 101. The process chamber 101 is provided with an exhaust pipes 108 at the bottom and a transfer inlet/outlet 109 at the side wall through which the silicon wafer 10 is transferred into and from the process chamber 101.

The silicon wafer 10 onto which $H_2$ plasma has been radiated as already described is placed on the table 102. A high frequency power of 1.0 KW, for example, is supplied to between the table 102 and gas chamber 103 to generate plasma. The wafer 10 is heated to 350° C., for example, by a heater (not shown) installed in the table 102 while the process chamber 101 is being maintained at a predetermined pressure through the exhaust pipe 108. Through the gas pipe 106, deposition gases, for example, $TiCl_4$ and $H_2$ gases are introduced into the process chamber 101 at flow rates of 10 sccm and 50 sccm, respectively, via the gas chamber 103. The deposition gases are transformed into plasma to deposit the Ti layer 3 on the CF film surface by chemical reaction $TiCl_4 + H_2 \rightarrow Ti + HCl$.

The Ti layer 3 thus deposited by CVD also exhibited a high level of adhesiveness between the CF film 2 and the Ti layer 3 to prevent peeling-off, which was proved by a experiment which will be discussed later. This is because the Ti layer 3 is deposited by CVD while the wafer 10 is being heated to 300° C. or more to let carbon at CF layer surface and titanium react with each other, thus forming the TiC 30 on the interface therebetween. The CVD-Ti deposition improves step coverage for fine pattern-semiconductor devices.

Moreover, Ar sputtering can be performed on the CF film surface after $H_2$ plasma radiation but before Ti layer deposition. This Ar sputtering can be conducted by the parallel-flat-type plasma system shown FIG. 12, the parallel-flat-type sputtering system shown FIG. 13 or the ECR plasma system shown in FIG. 15.

In such a system, Argon gas is transformed into plasma to radiate $H_2$ plasma onto CF film surface for 30 seconds for sputtering. This process improves the adhesiveness between the CF film 2 the Ti layer 3 because Ar sputtering eliminates $O_2$ and $H_2O$ which are absorbed on the CF film surface while the wafer 10 is being exposed to the air during the wafer transfer from the CF film depostion to the succeeding process.

For Ti layer deposition, a mixture of $TiCl_4$, $SiH_4$ and $H_2$ gases, a mixture of $TiI_4$ and $H_2$ gases or a mixture of $TiI_4$, $SiH_4$ and $H_2$ gases can be used.

Furthermore, a tantalum (Ta) can be used for a metallic layer instead of titanium. A mixture of $TaBr_5$ and $H_2$ gases, a mixture of $TaF_5$ and $H_2$ gases, a mixture of $TaCl_5$ and $H_2$ gases or $TaI_5$ and $H_2$ gases can be used for Ta layer deposition.

Disclosed next are several experiments conducted for verifying advantages of the semiconductor fabrication method according to the present invention.

Argon gas for plasma generation, and $C_4F_8$ and $C_2H_4$ gases for CF film deposition were introduced into the ECR plasma system shown in FIG. 15 at flow rates of 150 sccm, 40 sccm and 30 sccm, respectively, to form a 7000 angstrom-thick CF film on a silicon substrate. The silicon substrate was then annealed for 30 minutes at 425° C. in a nitrogen gas environment. After annealing, $H_2$ and Ar gases were introduced into the ECR system at flow rates of 50 sccm and 150 sccm, respectively, to radiate $H_2$ plasma onto the CF film surface for 15 seconds at 2.0 kW-microwave power and 0.5 kW-bias power.

Figures 22, 23:
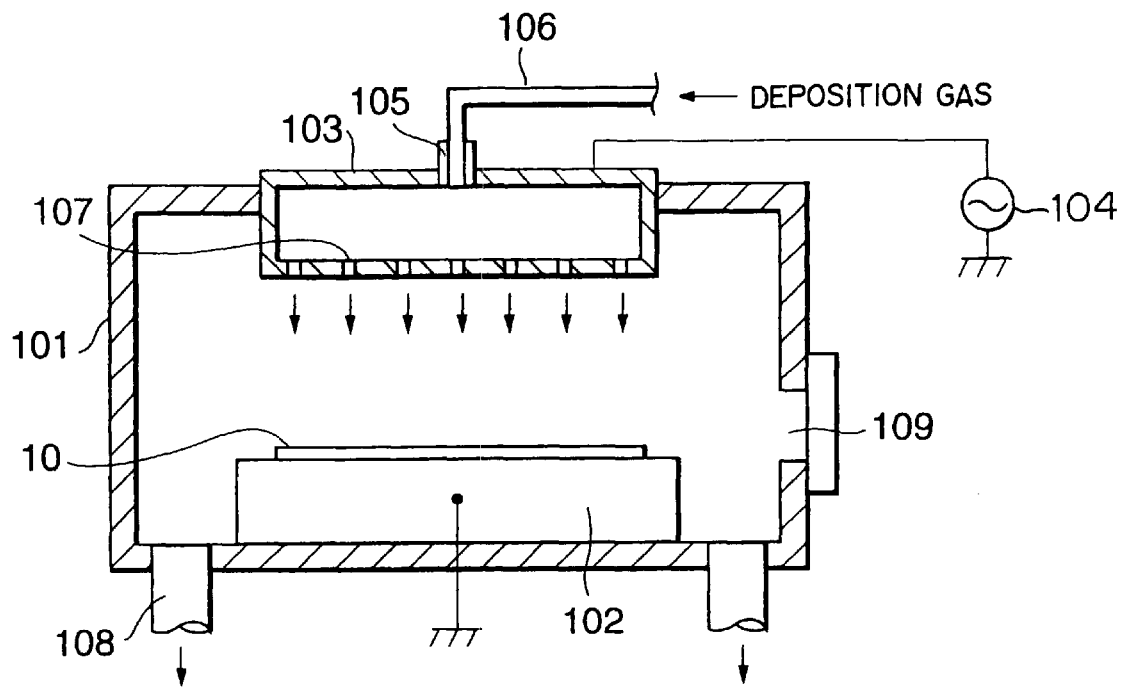
FIG. 22 is a cross-sectional view of a parallel-flat-type plasm system for Ti layer deposition.
FIG. 23 shows experimental tabulated data of adhesiveness between the CF film and Ti layer, CF film and Ta layer, and CF film and W layer.

The silicon substrate was then set in the system shown in FIG. 22. As Ti layer deposition gases, $TiCl_4$ and $H_2$ gases were introduced into the system at flow rates of 10 sccm and 50 sccm, respectively, to form a 300 angstrom-thick Ti layer on the CF film under $TiCl_4$ and $H_2$ plasma while the substrate was heated to 350° C. at 1 KW-micorpower. The adhesiveness between the CF film and the Ti layer was verified by Sebastian.

Another silicon substrate also formed with a CF film as disclosed above was then set in the ECR plasma system shown in FIG. 15 as a pre-process of Ti layer deposition. Argon gas was introduced into the ECR system at a flow rate of 150 sccm and transformed into plasma for sputtering the CF film layer for 30 seconds. A Ti layer was then deposited on the CF film in the same way as described above, to fabricate a semiconductor device. The adhesiveness between the CF film and the Ti layer of this device was also verified by Sebastian.

[Embodiment 2]

A semiconductor device was fabricated by using $TiCl_4$, $SiH_4$ and $H_2$ gases at flow rates 10 sccm, 2 sccm and 50 sccm, respectively, as Ti layer deposition gases. The other requirements were the same as those for the embodiment 1. The adhesiveness between the CF film and the Ti layer of this device was also verified. The adhesiveness was further verified for another device fabricated with Ar gas-sputtering (pre-process) before Ti layer deposition the same as for the Embodiment 1. In this embodiment, the introduced $SiH_4$ reacted with Cl more than with $H_2$ to form HCl that had removed Cl atoms from $TiCl_4$ for accelerating Ti layer deposition. Although, several Si atoms remained in the film to form TiSi, TiC (TiSiC) was observed.

[Embodiment 3]

A semiconductor device was fabricated by using $TiI_4$ and $H_2$ gases at flow rates 10 sccm and 50 sccm, respectively, as Ti layer deposition gases. The other requirements were the same as those for the embodiment 1. The adhesiveness between the CF film and the Ti layer of this device was also verified. The adhesiveness was further verified for another device fabricated with Ar gas-sputtering before Ti layer deposition the same as for the Embodiment 1.

[Embodiment 4]

A semiconductor device was fabricated by using $TiI_4$, $SiH_4$ and $H_2$ gases at flow rates 10 sccm, 2 sccm and 50 sccm, respectively, as Ti layer deposition gases. The other requirements were the same as those for the embodiment 1. The adhesiveness between the CF film and the Ti layer of this device was also verified. The adhesiveness was further verified for another device fabricated with Ar gas-sputtering before Ti layer deposition the same as for the Embodiment 1.

[Embodiment 5]

A semiconductor device was fabricated with a Ta layer as a metallic layer instead of a Ti layer by using $TaBr_5$ and $H_2$ gases at flow rates 10 sccm and 7 sccm, respectively, as Ta layer deposition gases. The other requirements were the same as those for the embodiment 1. The adhesiveness between the CF film and the Ta layer of this device was also verified. The adhesiveness was further verified for another device fabricated with Ar gas-sputtering before Ta layer deposition the same as for the Embodiment 1.

[Embodiment 6]

A semiconductor device was fabricated by using $TaF_5$ and $H_2$ gases at flow rates 10 sccm and 7 sccm, respectively, as Ta layer deposition gases. The other requirements were the same as those for the embodiment 1. The adhesiveness between the CF film and the Ta layer of this device was also verified. The adhesiveness was further verified for another device fabricated with Ar gas-sputtering before Ta layer deposition the same as for the Embodiment 1.

[Embodiment 7]

A semiconductor device was fabricated by using $TaCl_5$ and $H_2$ gases at flow rates 10 sccm and 7 sccm, respectively, as Ta layer deposition gases. The other requirements were the same as those for the embodiment 1. The adhesiveness between the CF film and the Ta layer of this device was also verified. The adhesiveness was further verified for another device fabricated with Ar gas-sputtering before Ta layer deposition the same as for the Embodiment 1.

[Embodiment 8]

A semiconductor device was fabricated by using $TaI_5$ and $H_2$ gases at flow rates 10 sccm and 7 sccm, respectively, as Ta layer deposition gases. The other requirements were the same as those for the embodiment 1. The adhesiveness between the CF film and the Ta layer of this device was also verified. The adhesiveness was further verified for another device fabricated with Ar gas-sputtering before Ta layer deposition the same as for the Embodiment 1.

FIG. 23 shows experimental tabulated data of adhesiveness for the embodiments 1 to 8. Every embodiment exhibited a high level of adhesiveness. The ninth embodiment (W layer) will be described later. It was verified that. CVD-deposition of Ti, Ta and W layer offers a high level of adhesiveness between the CF film and the metallic layer to prevent them from being peeling-off. Also verified was that Ar gas-sputtering before metallic layer deposition offers a higher level of adhesiveness between the CF film and the metallic layer.

Discussed next is another experiment II to verify advantages of the semiconductor device fabrication method according to the present invention.

The semiconductor device used in this experiment has a 0.5 μm-thick CF film on a silicon substrate, and a 100 angstrom-thick W layer and a 500 angstrom-thick WN layer on the CF film in order.

The fabrication requirements with an ECR plasma system for the experiment II is the same as that for the experiment I.

A substrate formed with a CF film was placed in the sputtering system shown in FIG. 13. The substrate was formed with a W layer on the CF film surface by introducing Ar gas at a flow rate of 70 sccm. After this, Ar and $N_2$ gases were introduced at flow rates of 40 sccm and 120 sccm, respectively, to form a WN layer at 1200W-bias power, to fabricate a semiconductor device as another embodiment.

FIG. 24 shows experimental tabulated data of the adhesiveness between the CF film and W layer by Sebastian between this semiconductor device and a sample device fabricated for comparison.

The sample device exhibited 1.0 kPsi or less on the points A to D (FIG. 16). On the other hand, the device of the present invention exhibited 5.2 to 6.8 kPsi on the same points, which are much higher than those for the sample device.

It was also verified by the experiment II that W layer deposition after $H_2$ plasma radiation to the CF film forms a WC layer (adhesive layer) on the interface between the CF film and the W layer, to offer a high level of adhesiveness therebetween.

Figure 25:
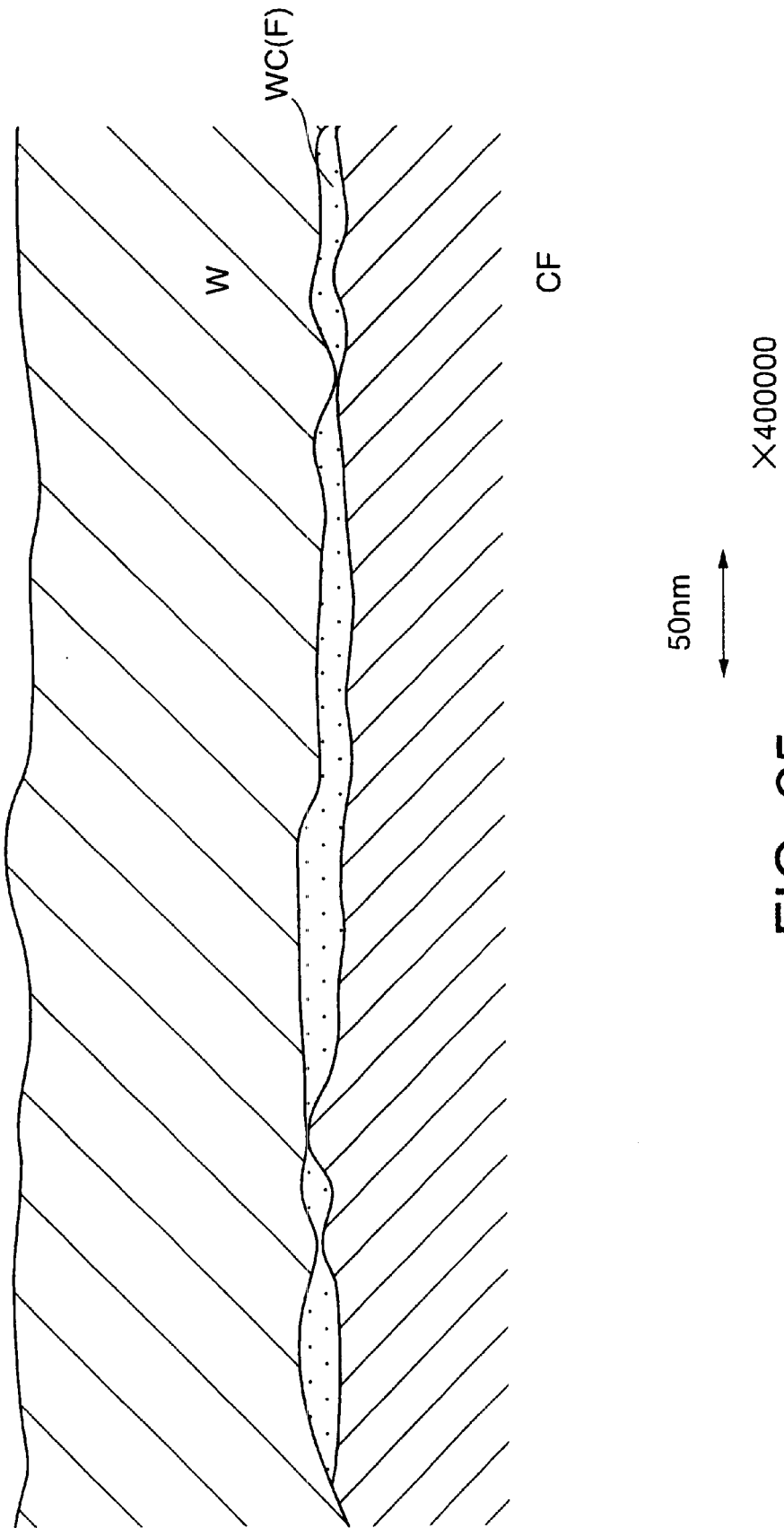
FIG. 25 is a cross-sectional view indicating the interface between the CF film and W layer observed by the TEM at a 400,000×magnification.
Figure 26:
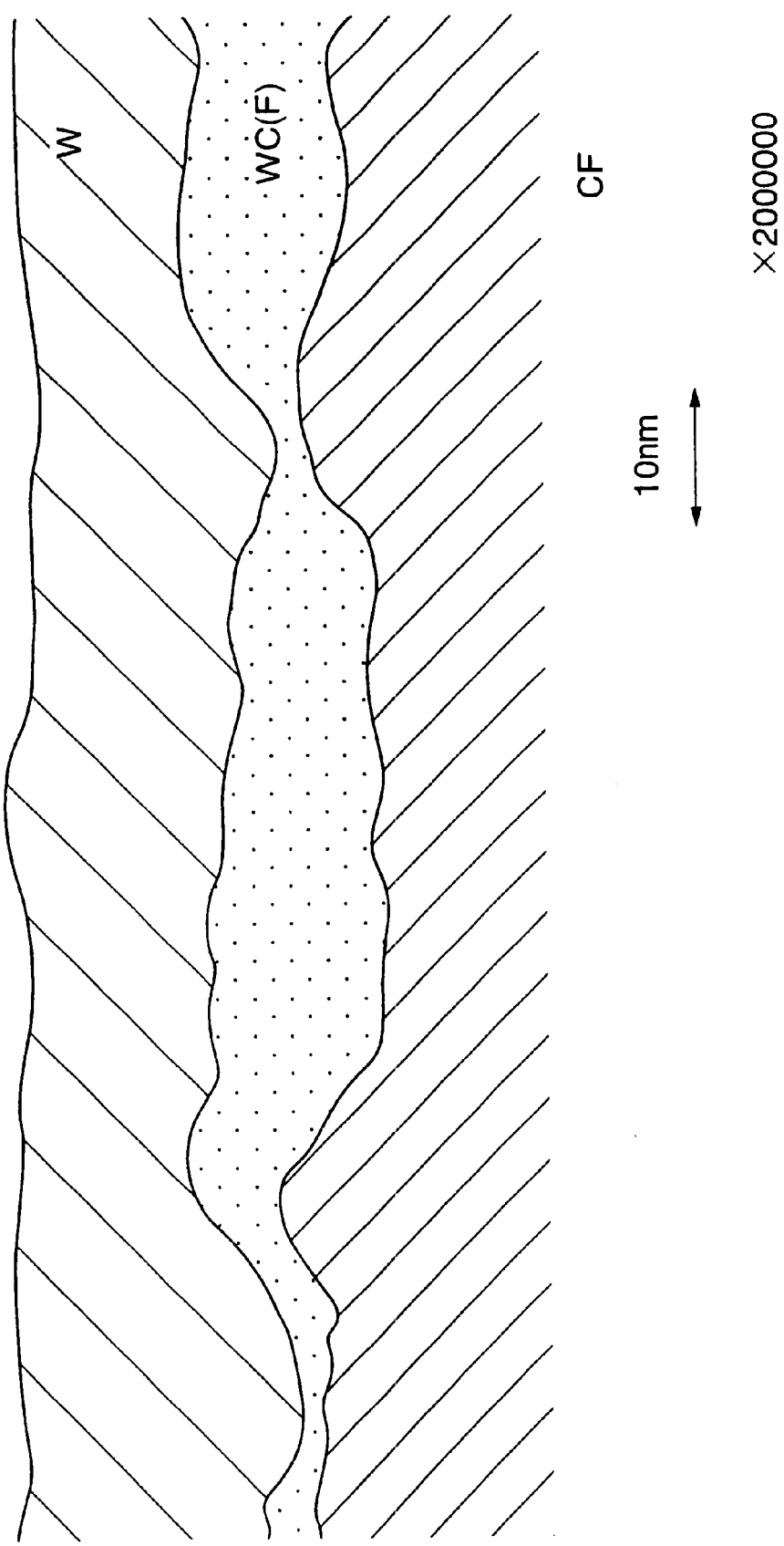
FIG. 26 is a cross-sectional view indicating the interface between the CF film and W layer observed by the TEM at a 2,000,000×magnification.

FIGS. 25 and 26 are cross-sectional views indicating the interface between the CF film and W layer of the device (experiment II) of the present invention observed by a Transmission Electron Microscope (TEM) at 400,000×and 2,000,000×magnification, respectively. The TEM-observation verified that a new layer different from the CF film and W layer was formed on the interface therebetween.

The inventors of the present invention conducted the following analysis to examine the composition of the new layer.

Figure 27A:
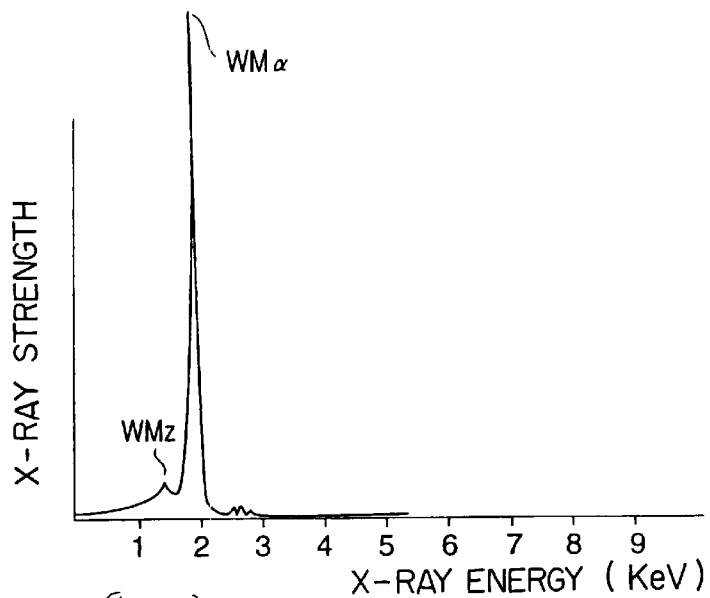
FIGS. 27A, 27B and 27C show graphs representing the results of analysis on the interface between the CF film and W layer by energy dispersive X-ray spectroscopy.
Figure 27B:
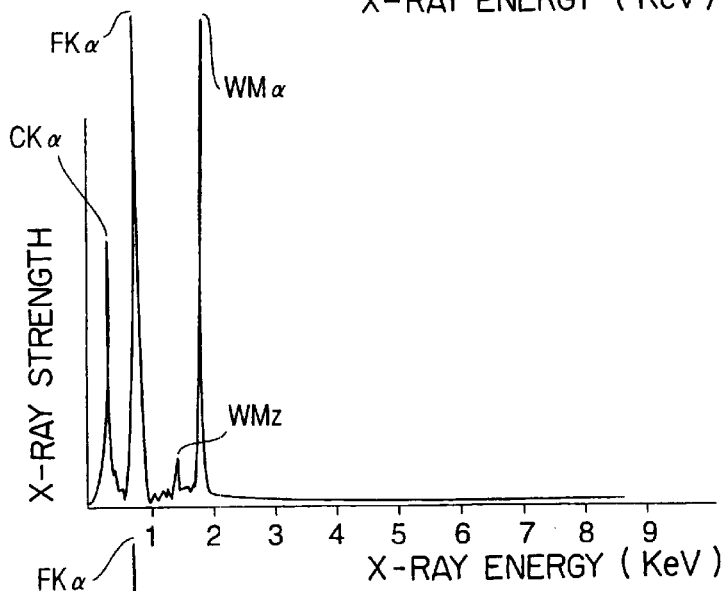
Figure 27C:
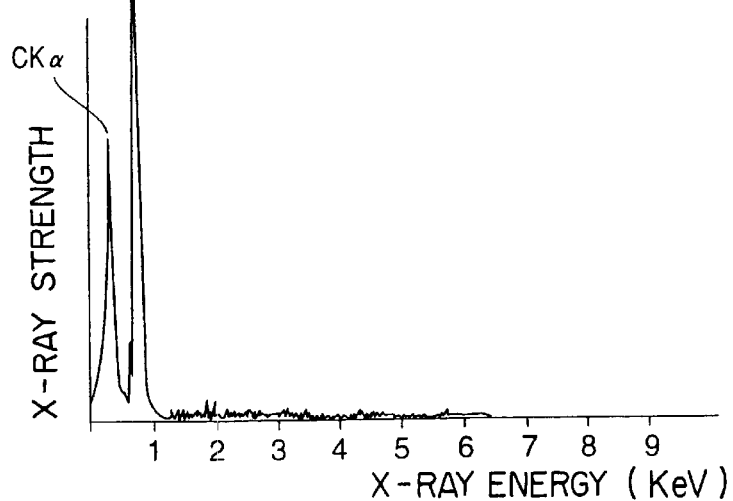

The energy dispersive X-ray spectroscopy was conducted on the CF film, the W layer and the interface layer formed therebetween, to form X-ray spectra, as shown in FIGS. 27A, 27B and 27C, respectively.

FIGS. 27A, 27B and 27C indicate X-ray spectrum for the W layer, the interface layer and the CF layer, respectively. The ordinate and abscissa of each graph represent the number of X-rays incident to the X-ray spectroscope and energy of incident X-rays. Through these figures, the sign $CK_\alpha$ indicates $K_\alpha$-rays (X-rays) generated by carbon atoms when irradiated with electron beams. The other signs $FK_\alpha$, $WM_z$ and $WM_\alpha$ also indicate the same meaning.

FIGS. 27A shows a W-peak. FIG. 27B teaches that the interface layer was made of a W-C compound. An actual amount of carbon atoms was larger than the peak value. Tungsten, carbon and fluorine in the interface layer were in the ratio of about W:C:F=100:40:15.

[Embodiment 9]

A semiconductor device was fabricated by using $WF_6$ and $H_2$ gases at flow rates 16.7 sccm and 83.3 sccm, respectively, as W layer deposition gases. The other requirements were the same as those for the embodiment 1. The adhesiveness between the CF film and the W layer of this device was verified. The adhesiveness was further verified for another device fabricated with Ar gas-sputtering before W layer deposition the same as for the Embodiment 1.

The experimental tabulated data of adhesiveness for the embodiment 9 is shown in FIG. 23. The embodiment 9 also exhibited a high level of adhesiveness. It was verified that CVD-deposition of W layer offers a high level of adhesiveness between the CF film and the W metallic layer to prevent them from being peeling-off. Also verified was that Ar gas-sputtering before metallic layer deposition offers a higher level of adhesiveness between the CF film and the metallic layer.

X-ray Photoelectron Spectroscopy (XPS) was conducted on the interface between the CF film and metallic layer for each embodiment of the semiconductor device. It was verified that the TiC layer, TaC layer and WC layer were formed on the interface between the CF film and Ti layer, CF film and Ta layer, and CF film and W layer, respectively. It was further verified that CVD-metallic layer deposition formed TiC, TAC and WC layers between the CF film and each metallic layer as an adhesive layer.

According to the present invention, $H_2$ plasma radiation can be conducted by the ECR plasma system shown in FIG. 15. Deposition of Ti, Ta and W layers can be conducted by thermal-CVD or sputtering other than plasma-CVD.

As described above, according to the present invention, a semiconductor device having a fluorine-added carbon film and a metallic layer formed thereon further has a compound (adhesive) layer of carbon and the metal of the metallic layer, thus achieving prevention of peeling-off between the fluorine-added carbon film and a metallic layer.

The present invention therefore achieves practical application of a fluorine-added carbon film that has been come up as a dielectric film having a low dielectric constant to meet demands for scaling-down and speeding-up for semiconductor devices.

What is claimed is:

1. A method of fabricating a semiconductor device comprising the steps of:
   a dielectric film forming step of forming a dielectric film made of fluorine-added carbon film on a substrate;
   a fluorine decreasing step of decreasing fluorine in density included in at least a surface region of the fluorine-added carbon film; and
   a metallic layer forming step of forming a metallic layer on a surface of the fluorine-added carbon film, after the fluorine decreasing step, wherein
   a compound layer including carbon and the metal is formed between the fluorine-added carbon film and the metallic layer during the metallic layer forming step.

2. The method according to claim 1, wherein the dielectric film forming step includes the step of decomposing a deposition gas including gas of a compound of fluorine and carbon to form the fluorine-added carbon film.

3. The method according to claim 2, wherein the deposition gas is made of $C_4F_8$ and $C_2H_4$.

4. The method according to claim 1 wherein the fluorine decreasing step includes the step of radiating plasma of hydrogen gas onto the surface of the fluorine-added carbon film.

5. The method according to claim 1, wherein the fluorine decreasing step includes the step of radiating plasma of hydrogen and argon gases.

6. The method according to claim 4 further including the step of radiating plasma of argon gas onto the surface of the fluorine-added carbon film after the plasma radiation step, the metallic layer being formed after these steps.

7. The method according to claim 1, wherein the fluorine decreasing step includes the step of soaking the substrate thus formed with the fluorine-added carbon film into water and heating the substrate thus soaked into the water.

8. The method according to claim 1, wherein the metallic layer forming step includes the step of forming the metallic layer by sputtering the metal while the substrate is being heated.

9. The method according to claim 1, wherein the metallic layer forming step includes the step of forming the metallic layer by chemical vapor deposition using a deposition gas including the metal while the substrate is being heated.

10. The method according to claim 9, wherein the metal is titanium, and the deposition gas includes a mixture of $TiCl_4$ and $H_2$, $TiCl_4$, $SiH_4$ and $H_2$, $TiI_4$ and $H_2$ or $TiI_4$, $SiH_4$ and $H_2$.

11. The method according to claim 9, wherein the metal is tantalum, and the deposition gas includes a mixture of $TaBr_5$ and $H_2$, $TaF_5$ and $H_2$, $TaCl_5$ and $H_2$ or $TaI_5$ and $H_2$.

12. A method of fabricating a semiconductor device comprising the steps of:
   a dielectric film forming step of forming a dielectric film made of fluorine-added carbon film on a substrate;
   a fluorine decreasing step of decreasing fluorine in density included in at least a surface region of the fluorine-added carbon film;
   a metallic layer forming step of forming a metallic layer on a surface of the fluorine-added carbon film; and
   a compound layer forming step of forming a compound layer including carbon and the metal between the fluorine-added carbon film and the metallic layer while the substrate is being heated for a predetermined period.

13. The method according to claim 8, wherein the metallic layer forming step includes the step of forming a nitride layer of the metal by sputtering the metal in a nitrogen gas environment after the metallic layer is formed.

* * * * *